(12) United States Patent
Chen et al.

(10) Patent No.: US 11,382,234 B2
(45) Date of Patent: Jul. 5, 2022

(54) CONNECTION DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 890 days.

(21) Appl. No.: 16/203,523

(22) Filed: Nov. 28, 2018

(65) Prior Publication Data

US 2020/0029457 A1   Jan. 23, 2020

(30) Foreign Application Priority Data

Jul. 19, 2018   (TW) .................................. 107125285

(51) Int. Cl.
*H05K 7/14*   (2006.01)
(52) U.S. Cl.
CPC .................. *H05K 7/1491* (2013.01)

(58) Field of Classification Search
CPC .................................................... H05K 7/1491
See application file for complete search history.

(56) References Cited

U.S. PATENT DOCUMENTS

| 7,473,846 | B2 | 1/2009 | Doerr |
| 8,634,198 | B2 | 1/2014 | Chen |
| 8,833,715 | B2 | 9/2014 | Chen |
| 9,167,717 | B2 | 10/2015 | Chen |
| 9,480,182 | B2 | 10/2016 | Chen |

FOREIGN PATENT DOCUMENTS

| EP | 2 849 550 A1 | 3/2015 |
| JP | H04-68207 U | 6/1992 |

*Primary Examiner* — James Wu
*Assistant Examiner* — Hung Q Dang
(74) *Attorney, Agent, or Firm* — Winston Hsu

(57) ABSTRACT

A connection device is detachably connected to an object. The object includes a connecting feature. The connection device includes a connecting member, an engaging member and a mounting member. The connecting member includes a base and a connecting portion connected to the base. The engaging member is connected to the connecting member and has an engaging portion. The mounting member is attached to the connecting member. When the mounting member abuts against the connecting feature of the object, the engaging portion of the engaging member is able to be engaged with the object at a position such that the base of the connecting member is connected to the object.

20 Claims, 9 Drawing Sheets

CONNECTION DEVICE

BACKGROUND OF THE INVENTION

1. Field of the Invention

The present invention relates to a connection device, and more particularly, to a connection device that is implemented on an object, such as a rail member.

2. Description of the Prior Art

U.S. Pat. No. 8,833,715 B2 describes a connection device for a cable management arm and a slide assembly. Specifically, as shown in FIG. 1 of said patent, a rail (20) of a slide assembly (12) can be connected to a connection member (26) of a first arm (16) of a cable management arm (10) through a connection device (14), an insertion piece (30) of the connection device is fixed to the rail (20) of the slide assembly (12) therein—as described in col. 4 row 27 of the said patent. Therefore, the insertion piece (30) cannot be removed from the rail (20).

However, the insertion piece (30) of the connection device (14) is fixedly connected to (that is, not detachable from) the rail (20). Therefore, with respect to the operation, maintenance or structural arrangement of the rails on the slide assembly, the connection device (14) is a superfluous component of a slide rail that may affect the market demands of such rail.

SUMMARY OF THE INVENTION

The present invention relates to a connection device that is implemented on an object.

According to an aspect of the present invention, a connection device is detachably connected to an object. The object comprises a connecting feature, and the connection device comprises a connecting member, an engaging member and at least one mounting member. The connecting member comprises abase and a connecting portion connected to the base; the engaging member is connected to the connecting member, and the engaging member has at least one engaging portion; the at least one mounting member is fixedly attached to the connecting member; wherein when the at least one mounting member and the connecting feature of the object abut against each other, the at least one engaging portion of the engaging member is able to be engaged with the object at an engaging position of the object such that the base of the connecting member is connected to the object; wherein the engaging member is operable to disengage the at least one engaging portion from the engaging position of the object such that the at least one mounting member is able to detach from the connecting feature of the object and allow the connecting member to be removed from the object.

Preferably, the base of the connecting member has a first surface and a second surface opposite to the first surface, and the engaging member is connected to the first surface of the base of the connecting member.

Preferably, the at least one mounting member is fixedly attached to the second surface of the base of the connecting member.

Preferably, the connecting feature of the object comprises an entrance end, a closed end, and a middle section between the entrance end and the closed end, and the engaging position of the object is at the entrance end of the object.

Preferably, the base of the connecting member has at least one through hole for the at least one engaging portion of the engaging member to pass through and correspond with the entrance end of the object.

Preferably, the entrance end of the connecting feature of the object has a first width, the middle section of the connecting feature of the object has a second width smaller than the first width, the at least one mounting member comprises a head portion and a body portion, an outer dimension of the head portion is smaller than the first width and larger than the second width; wherein when the head portion enters the entrance end of the connecting feature of the object and passes through the middle section to abut the closed end, the head portion is engaged with the object at the engaging position via the at least one engaging portion of the engaging member such that the head portion cannot freely detach from the entrance end of the connecting feature of the object.

Preferably, the connecting feature of the object comprises an entrance end, a closed end, and a middle section between the entrance end and the closed end, the entrance end of the connecting feature of the object has a first width, the middle section of the connecting feature of the object has a second width substantially equal to the first width, the at least one mounting member comprises a head portion and a body portion, an outer dimension of the head portion is larger than the first width, an outer dimension of the body portion is smaller than the first width; wherein when the head portion enters the entrance end of the connecting feature of the object and pass through the middle section to abut the closed end, the head portion is engaged with the object at the engaging position via the at least one engaging portion of the engaging member such that the head portion cannot freely detach from the entrance end of the connecting feature of the object.

Preferably, the engaging member has at least one resilient arm connected to the at least one engaging portion.

Preferably, the object is a rail member.

Preferably, the connecting portion of the connecting member is configured to be connected to a cable management arm.

Preferably, the connection device further comprises an operating member pivotally connected to the connecting member, the operating member having a contacting feature abutting against a portion of the engaging member such that the at least one engaging portion of the engaging member can move relative to the connecting member via operating the operating member.

Preferably, the object further comprises another connecting feature and another mounting member fixedly attached to the connecting member such that when the connecting member connects to the object, the another mounting member and the another connecting feature can abut each other.

Preferably, the engaging position of the object is at a positioning hole of the object, and a position of the positioning hole is different from a position of the connecting feature.

According to another embodiment of the present invention, a connection device is detachably connected to a rail member. The rail member comprises a connecting feature, and the connection device comprises a connecting member, an engaging member and at least one mounting member. The connecting member comprises a base and a connecting portion connected to the base; the engaging member is connected to the connecting member; the engaging member has at least one engaging portion; the at least one mounting member is attached to the connecting member; the at least one mounting member comprises a head portion and a body portion; wherein, the connecting feature of the rail member comprises an entrance end, a closed end and a middle section between the entrance end and the closed end. The entrance end of the connecting feature of the rail member has a first width, and the middle section has a second width smaller than the first width. An outer dimension of the head portion of the at least one mounting member is smaller than the first width and larger than the second width, wherein when the head portion enters the entrance end of the connecting feature of the rail member and passes through the middle section to abut the closed end, the at least one engaging portion of the engaging member is engaged with the rail member at an engaging position of the rail member such that the head portion cannot freely detach from the entrance end of the connecting feature of the rail member. The engaging member is operable to disengage the at least one engaging portion from the engaging position of the rail member such that the at least one mounting member is able to detach from the connecting feature of the rail member and allow the connecting member to be removed from the rail member.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
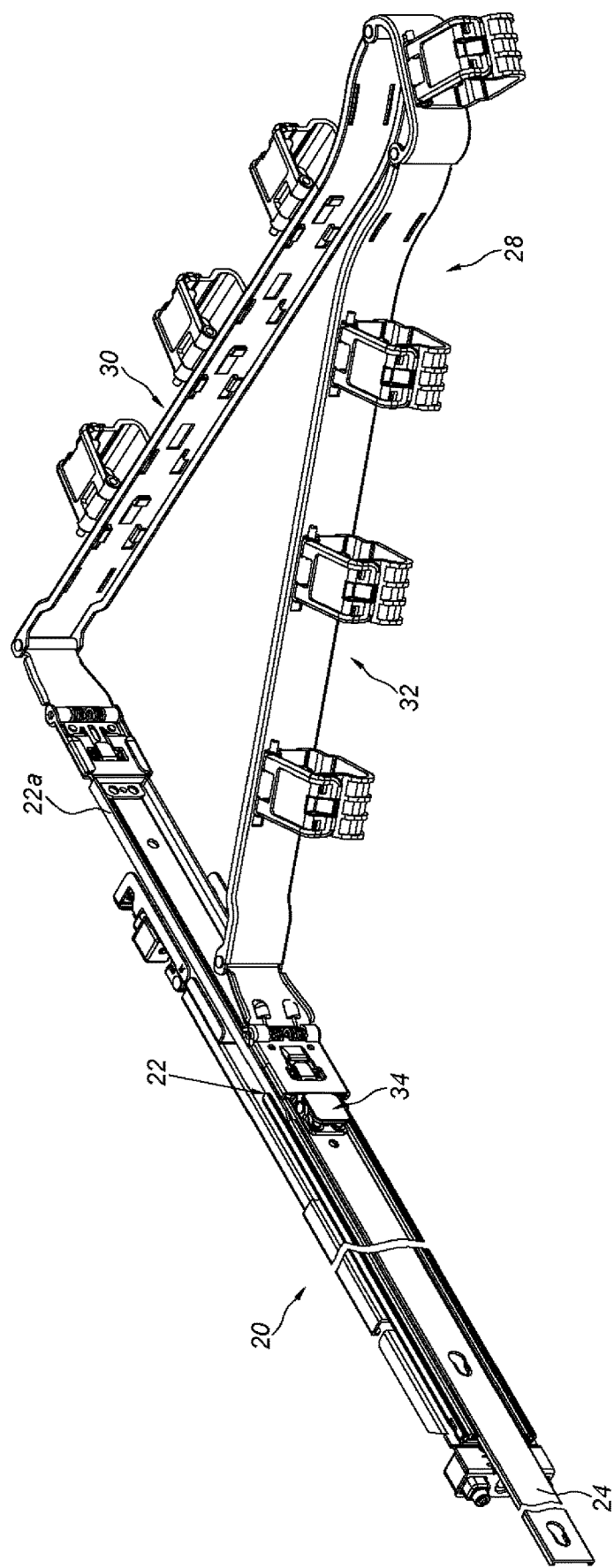
FIG. 1 is a schematic diagram illustrating a connection device connecting a rail member of a slide rail assembly to a cable management arm of a cable management device according to a first embodiment of the present invention.
Figure 2:
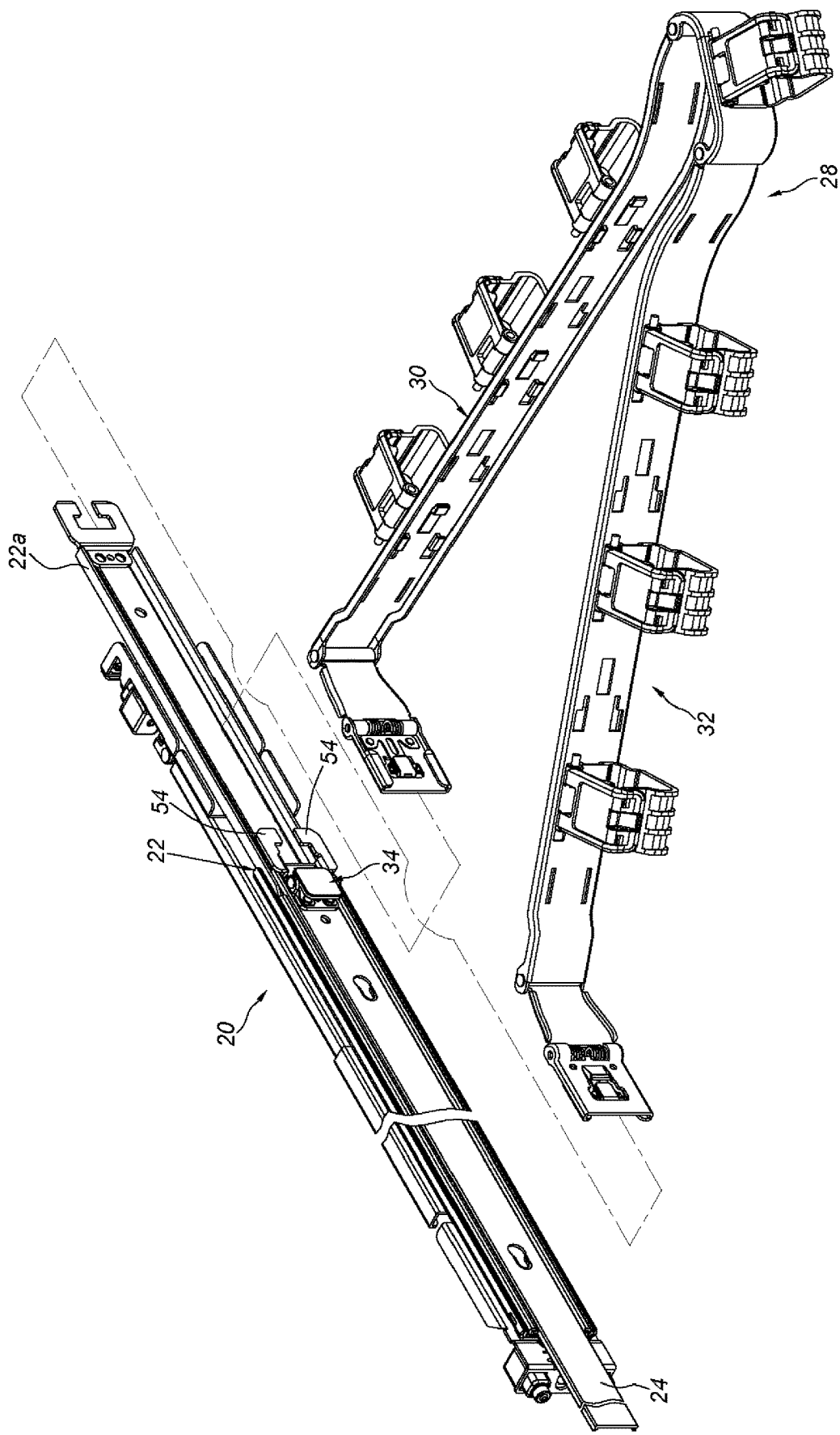
FIG. 2 is a schematic diagram illustrating the slide rail assembly and the cable management device according to the first embodiment of the present invention.

As shown in FIGS. 1 and 2, the slide rail assembly 20 of the first embodiment of the present invention comprises a first rail member 22 and a second rail member 24 movable relative to the first rail member 22, wherein the cable management device 28 is used to manage cables of a carried object (such as an electronic apparatus) carried by the slide rail assembly 20. The cable management device 28 comprises a first cable management arm 30 and a second cable management arm 32, and one end of the first cable management arm 30 and one end of the second cable management arm 32 is pivotally connected to each other. Another end of the first cable management arm 30 is detachably connected to the rear end portion 22a of the first rail member 22, and another end of the second cable management arm 32 is detachably connected to a connection device 34. In practical application, the connection device 34 is detachably connected to an object. In the present embodiment, the object is a rail member, and the second rail member 24 is illustrative of an example of the rail member hereinafter.

Figure 3:
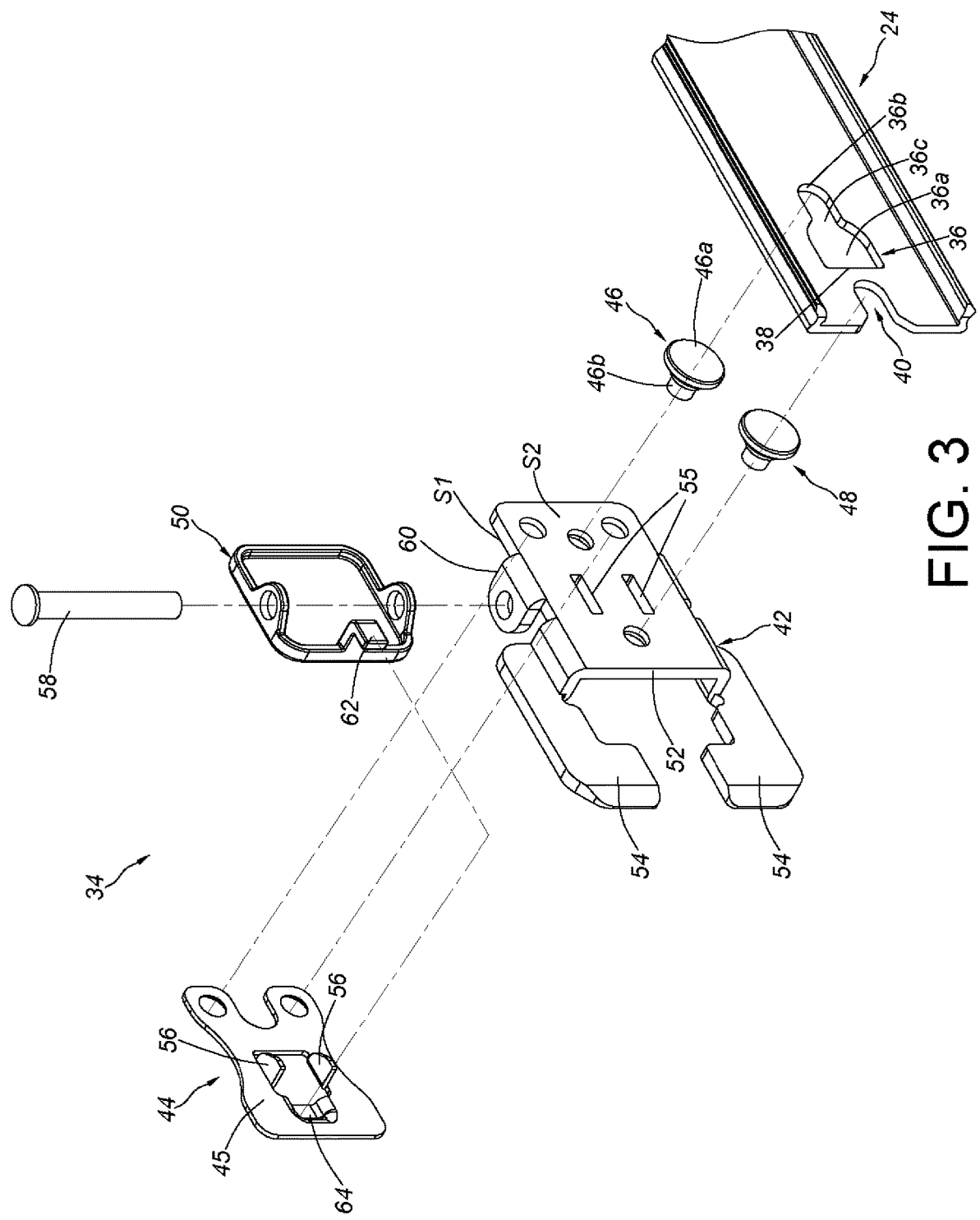
FIG. 3 is an exploded diagram illustrating the connection device according to the first embodiment of the present invention.
Figure 4:
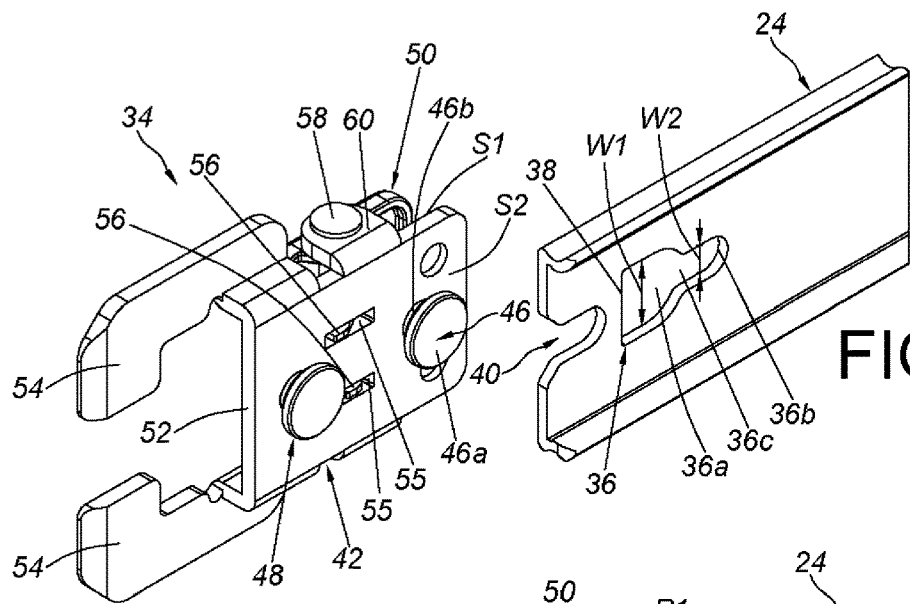
FIG. 4 is a schematic diagram illustrating the connection device and the rail member according to the first embodiment of the present invention.

As shown in FIGS. 3 and 4, the second rail member 24 comprises a connecting feature 36. The connecting feature 36 comprises an entrance end 36a, a closed end 36b, and a middle section 36c between the entrance end 36a and the closed end 36b. The second rail member 24 has an engaging position 38 at the entrance end 36a, and as an example, the engaging position 38 is defined by the walls or surfaces surrounding the entrance end 36a. More specifically, the entrance end 36a of the connecting feature 36 has a first width W1, and the middle section 36c has a second width W2 smaller than the first width W1. Preferably, the second rail member 24 further comprises another connecting feature 40 that is separate from the connecting feature 36. As an example, the another connecting feature 40 can be a slot, but the present invention is not limited thereto.

The connection device 34 comprises a connecting member 42, an engaging member 44 and at least one mounting member 46. Preferably, the connection device 34 further comprises another mounting member 48 and an operating member 50.

The connecting member 42 comprises a base 52 and a connecting portion 54 connected to the base 52. Preferably, the connecting portion 54 is for a cable management arm (such as the aforementioned second cable management arm 32) to connect to the connecting member 42. Preferably, the base 52 has a first surface S1 and a second surface S2 opposite to the first surface S1. Preferably, the base 52 of the connecting member 42 has at least one through hole 55.

The engaging member 44 connects to the connecting member 42. The engaging member 44 has at least one engaging portion 56. The at least one engaging portion 56 is, for example, a protrusion or a hook, the present invention not limited thereto. Preferably, the engaging member 44 has at least one resilient arm 45 connected to the at least one engaging portion 56. Preferably, the engaging member 44 connects to the first surface S1 of the base 52 of the connecting member 42. Preferably, the at least one engaging portion 56 of the engaging member 44 passes through the through hole 55 of the connecting member 42, and a position of the at least one engaging portion 56 corresponds to the entrance end 36a of the second rail member 24 (please refer to FIG. 6).

The at least one mounting member 46 and the another mounting member 48 are attached to the connecting member 42. Preferably, the at least one mounting member 46 and the another mounting member 48 are fixedly attached to the second surface S2 of the base 52 of the connecting member 42. The at least one mounting member 46 comprises a head portion 46a and a body portion 46b connected to the head portion 46a. One end of the body portion 46b connects to the second surface S2 of the base 52 of the connecting member 42. Furthermore, an outer dimension of the head portion 46a is smaller than the first width W1 of the connecting feature 36, and the outer dimension of the head portion 46a is larger than the second width W2 of the connecting feature 36. Wherein, the outer dimension of the body portion 46b is no greater than the second width W2 of the connecting feature 36. Preferably, the two said mounting members 46, 48 have identical structural features.

The operating member 50 is configured to operate the engaging member 44 to move. Preferably, the operating member 50 is pivotally connected to at least one ear portion 60 of the connecting member 42 via a shaft member 58.

Figure 5:
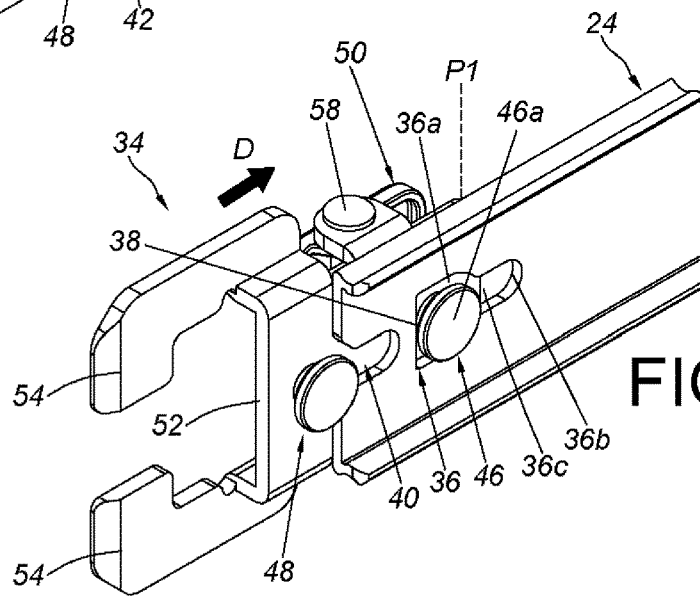
FIG. 5 is a schematic diagram illustrating a mounting process of the connection device being mounted to the rail member according to the first embodiment of the present invention.

During a mounting process (as shown in FIGS. 4 and 5), the connection device 34 can be at a first position P1 relative to the second rail member 24. When the connection device 34 is at the first position P1 (shown in FIG. 5), the head portion 46a of the at least one mounting member 46 can pass through the entrance end 36a of the connection feature 36 of the second rail member 24. On the other hand, the another mounting member 48 is close to the entrance of the another connecting feature 40 of the second rail member 24.

Figure 6:
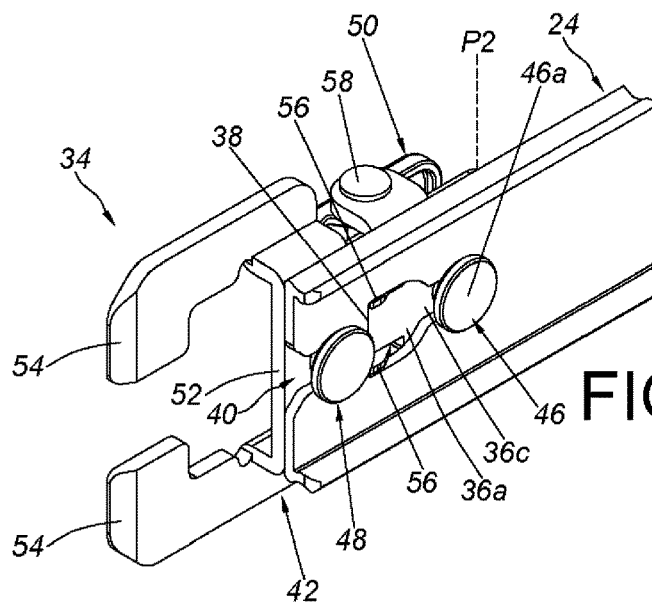
FIG. 6 is a schematic diagram illustrating the connection device being connected to the rail member according to the first embodiment of the present invention.
Figure 7:
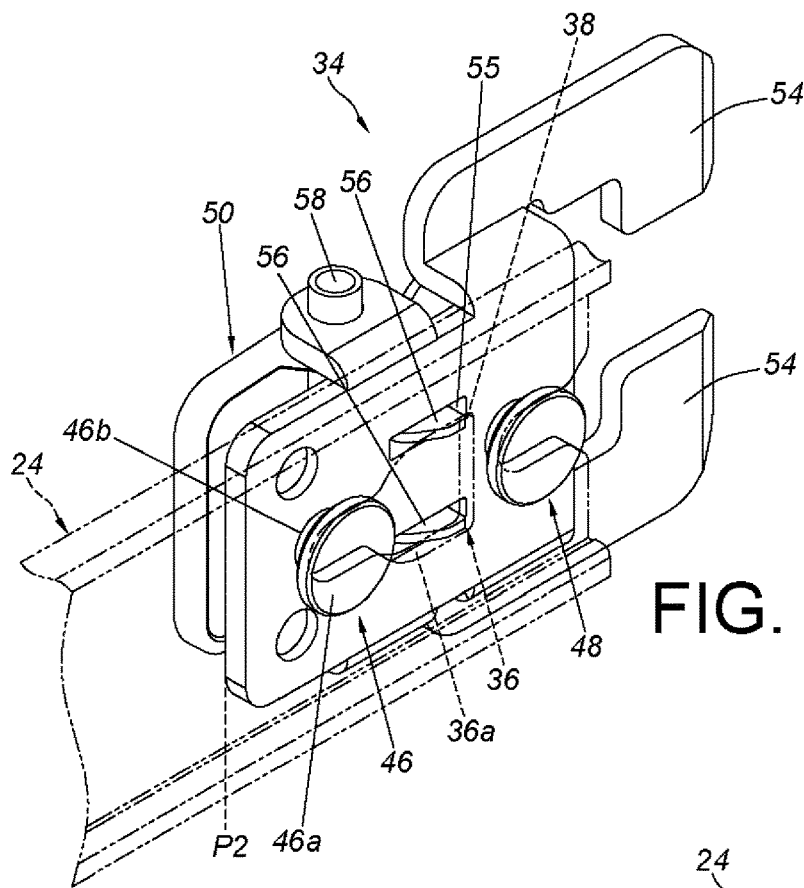
FIG. 7 is a schematic diagram illustrating a viewing angle of the connection device being connected to the rail member, and an engaging portion being engaged at a position of the rail member according to the first embodiment of the present invention.
Figure 8:
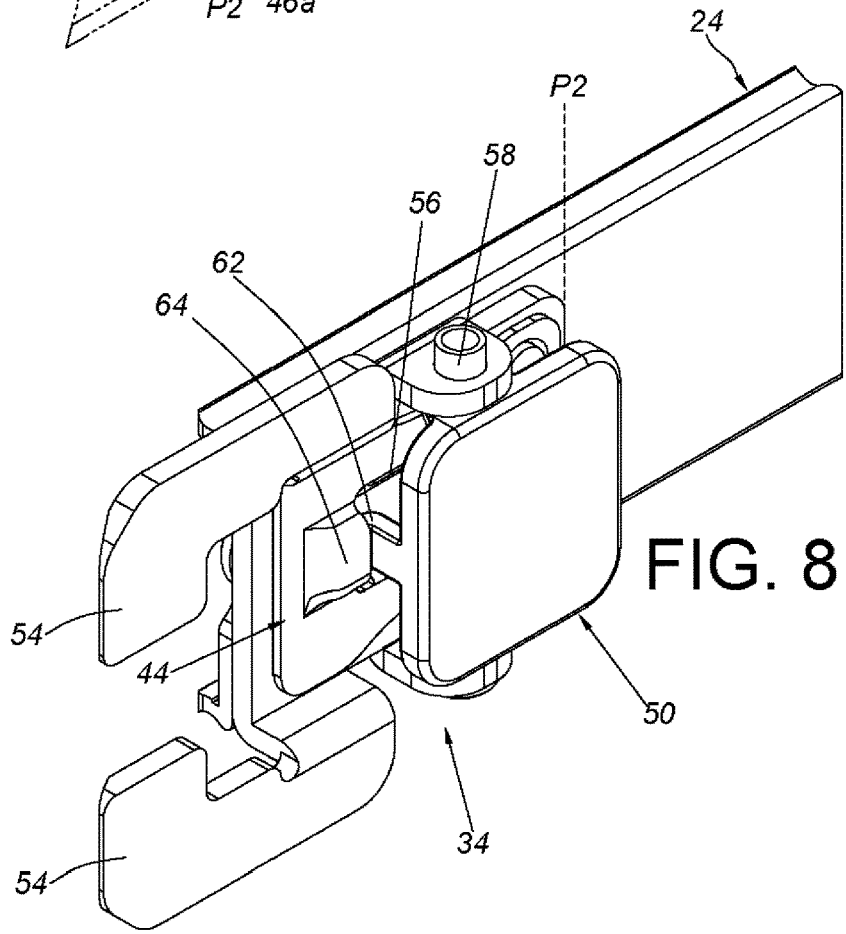
FIG. 8 is a schematic diagram illustrating another viewing angle of the connection device being connected to the rail member, and the engaging portion being engaged at the position of the rail member according to the first embodiment of the present invention.

As shown in FIGS. 6, 7 and 8, the mounting process of the connection device 34 being connected to the second rail member 24 is complete when the connection device 34 is configured at a second position P2 relative to the second rail member 24. When the at least one mounting member 46 of the connection device 34 and the connecting feature 36 of the second rail member 24 abut against each other, the at least one engaging portion 56 of the engaging member 44 can be engaged at the engaging position 38 of the second rail member 24 such that the base 52 of the connecting member 42 connects to the second rail member 24. Preferably, when the connecting member 42 is connected to the second rail member 24, the another mounting member 48 and the another connecting feature 40 abut against each other.

In practical application, the connection device 34 can move in a direction D from the first position P1 (shown in FIG. 5) to the second position P2 (shown in FIG. 6) relative to the second rail member 24. During this process, the head portion 46a of the at least one mounting member 46 passes through the middle section 36c via the entrance end 36a of the connecting feature 36 and abut against the closed end 36b. At this time, the head portion 46a is engaged with the second rail member 24 at the engaging position 38 via the at least one engaging portion 56 of the engaging member 44 such that the head portion 46a cannot freely detach or be removed from the entrance end 36a of the connecting feature 36 of the second rail member 24. Preferably, the at least one engaging portion 56 remains being engaged with the engaging position 38 of the second rail member 24 through an elastic force of the aforementioned resilient arm 45. On the other hand, when the connection device 34 is at the second position P2 relative to the second rail member 24, the another mounting member 48 enters and abuts against the another connecting feature 40 of the second rail member 24.

When the connection device 34 is at the second position P2 relative to the second rail member 24 (as shown in FIGS. 7, 8, 9 and 10), the engaging member 44 is operable to disengage the at least one engaging portion 56 from the engaging position 38 of the second rail member 24 such that the at least one mounting member 46 is able to detach from the connecting feature 36 of the second rail member 24 and allow the connecting member 42 to be removed from the second rail member 24.

Figure 9:
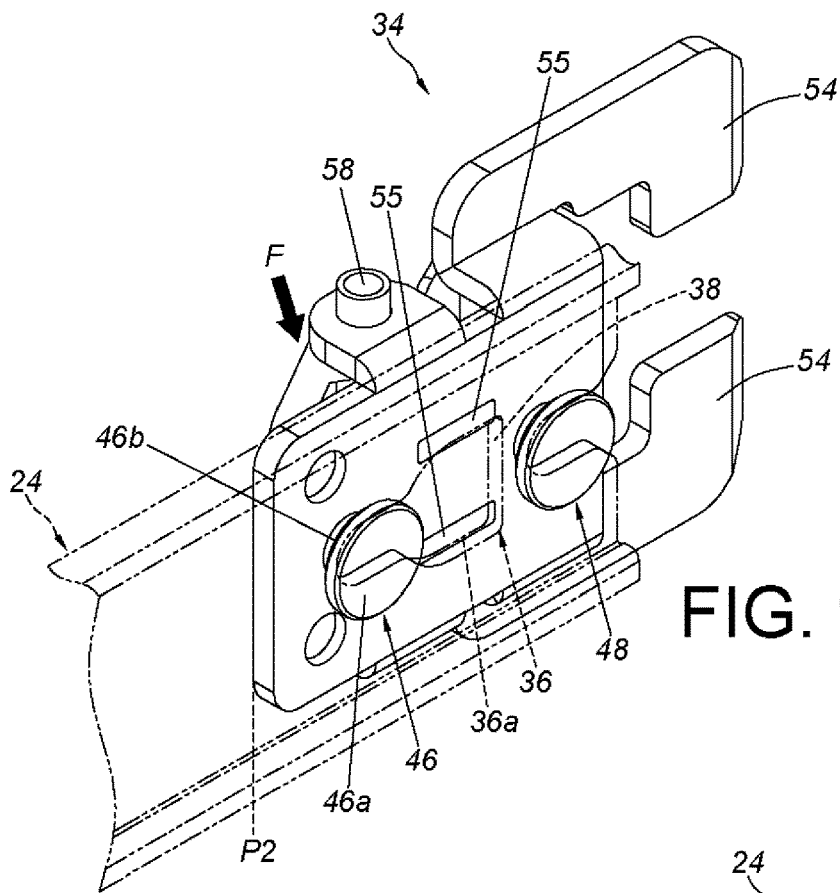
FIG. 9 is a schematic diagram illustrating the viewing angle of the connection device being connected to the rail member, and the engaging portion being disengaged from the position of the rail member according to the first embodiment of the present invention.
Figure 10:
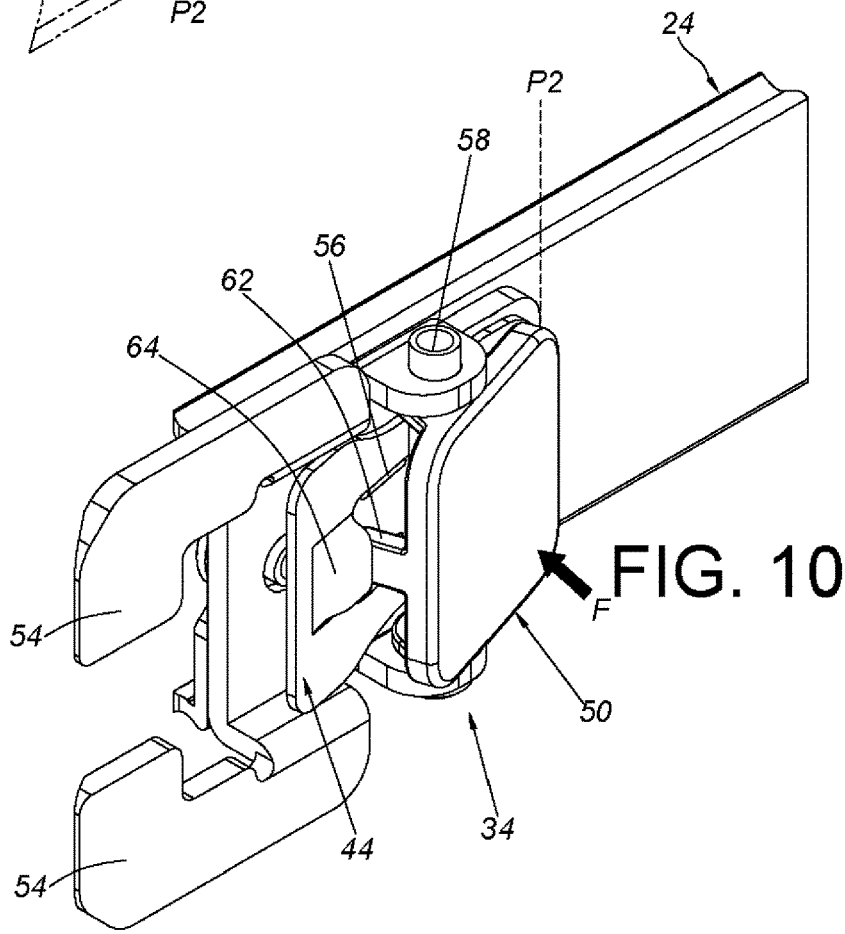
FIG. 10 is a schematic diagram illustrating the another viewing angle of the connection device being connected to the rail member, and the engaging portion being disengaged from the position of the rail member according to the first embodiment of the present invention.

In practical application, if a user desires to remove the connection device 34 from the second rail member 24, the user can operate the engaging member 44 (as shown in FIG. 10) such that the at least one engaging portion 56 of the engaging member 44 is no longer engaged at the engaging position 38 of the second rail member 24 (wherein the at least one engaging portion 56 of the engaging member 44 moves from being engaged at the engaging position 38 of the second rail member 24, as illustrated in FIG. 7, to being disengaged from the engaging position 38 of the second rail member 24, as illustrated in FIG. 9), allowing the head portion 46a of the at least one mounting member 46 to be backed out or detached from the entrance end 36a of the connecting feature 36 of the second rail member 24. In other words, the connecting member 42 is able to detach from the connecting feature 36 of the second rail member 24, allowing the connecting member 42 to be removed from the second rail member 24 (please refer to FIGS. 5 and 4 in sequence regarding how to remove the connecting member 42 from the second rail member 24). Preferably, the operating member 50 has a contact feature 62 that abuts against a portion 64 of the engaging member 44 (shown in FIG. 8). As a force F is applied to the operating member 50 (shown in FIG. 10), the at least one engaging portion 56 of the engaging member 44 becomes movable relative to the connecting member 42, causing the at least one engaging portion 56 to no longer be engaged with the second rail member 24 at the engaging position 38.

Figure 11:
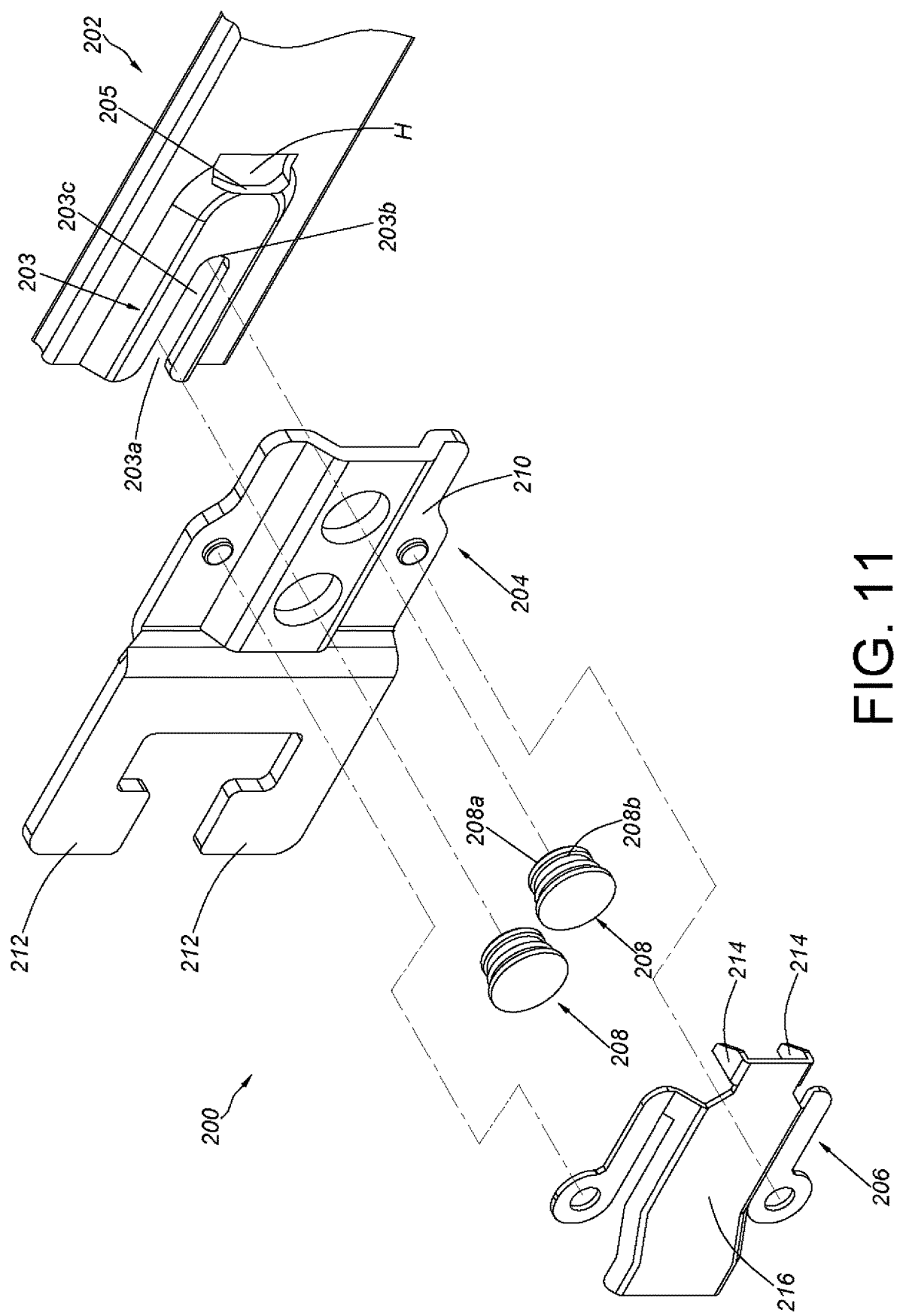
FIG. 11 is an exploded diagram illustrating a connection device according to the second embodiment of the present invention.
Figure 12:
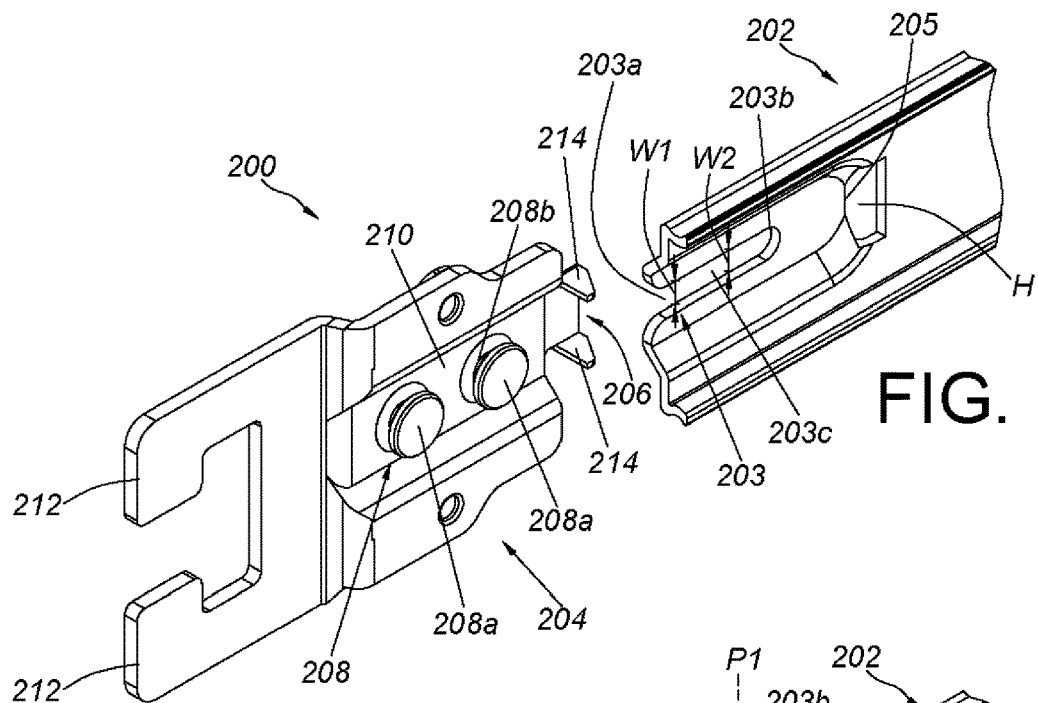
FIG. 12 is a schematic diagram illustrating the connection device and a rail member according to the second embodiment of the present invention.

As shown in FIGS. 11 and 12, the connection device 200 of the second embodiment of the present invention is detachably connected to an object, the object being a rail member 202. A connecting feature 203 of the rail member 202 comprises an entrance end 203a, a closed end 203b and a middle section 203c between the entrance end 203a and the closed end 203b. The entrance end 203a has a first width W1, and the middle section 203c has a second width W2 substantially equal to the first width W1. An engaging position 205 of the rail member 202 is at a positioning hole H of the rail member 202, and a position of the positioning hole H is different from a position of the connecting feature 203; that is, the engaging position 205 is defined by the walls or surfaces surrounding the positioning hole H.

The connection device 200 comprises a connecting member 204, an engaging member 206 and at least one mounting member 208. The connecting member 204 comprises a base 210 and a connecting portion 212 connected to the base 210. The engaging member 206 connects to the connecting member 204, and the engaging member 206 has at least one engaging portion 214. Preferably, the engaging member 206 has at least one resilient arm 216 connected to the at least one engaging portion 214. The at least one mounting member 208 attaches to the connecting member 204; for example, the at least one mounting member 208 is disposed on the base 210 of the connecting member 204. Preferably, the at least one mounting member 208 comprises a head portion 208a and a body portion 208b; an outer dimension of the head portion 208a is larger than the first width W1, and an outer dimension of the body portion 208b is smaller than the first width W1.

Figure 13:
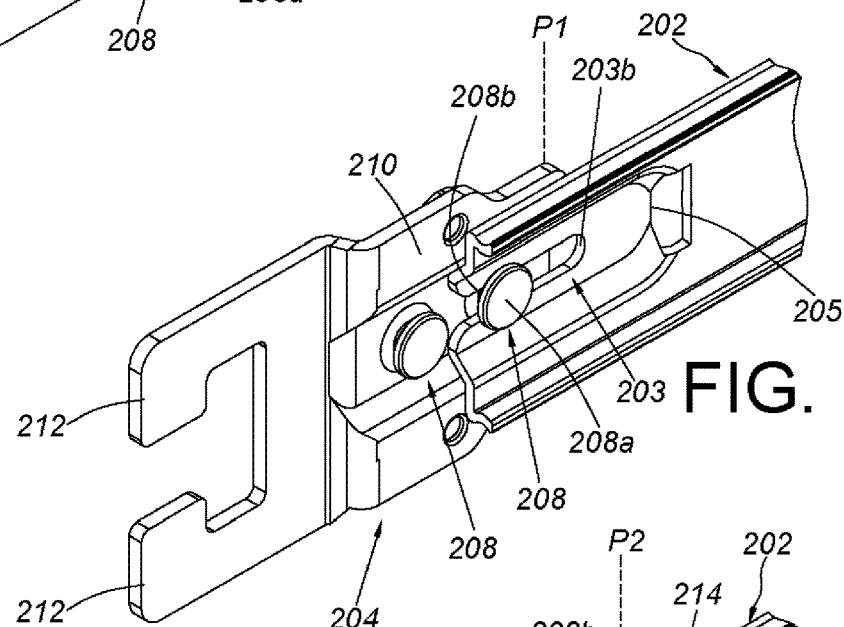
FIG. 13 is a schematic diagram illustrating a mounting process of the connection device being mounted to the rail member according to the second embodiment of the present invention.
Figure 14:
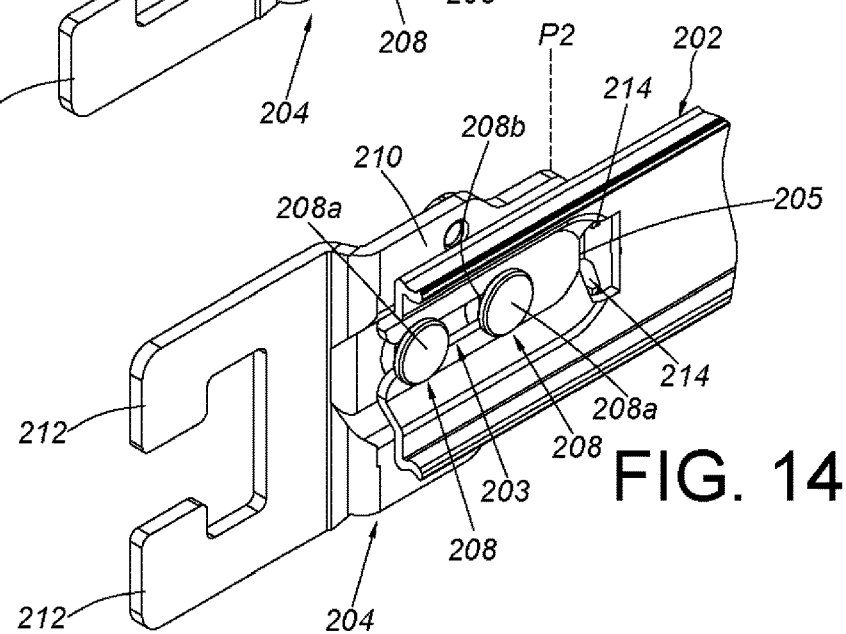
FIG. 14 is a schematic diagram illustrating the connection device being connected to the rail member according to the second embodiment of the present invention.

As shown in FIGS. 12, 13, 14, when the at least one mounting member 208 and the connecting feature 203 of the rail member 202 abut against each other, the at least one engaging portion 214 of the engaging member 206 is able to be engaged with the rail member 202 at the engaging position 205 (shown in FIG. 14) such that the base 210 of the connecting member 204 is connected to the rail member 202.

In practical application, the connection device 200 can move from a first position P1 (as shown in FIG. 13) to a second position P2 (as shown in FIG. 14) relative to the rail member 202. During this process, the head portion 208a of the at least one mounting member 208 of the connection device 200 passes through the middle section 203c via the entrance end 203a of the connecting feature 203 and abut against the closed end 203b (as shown in FIG. 14). At this time, the head portion 208a is engaged with the rail member 202 at the engaging position 205 via the at least one engaging portion 214 of the engaging member 206 such that the head portion 208a cannot freely detach or be removed from the entrance end 203a of the connecting feature 203 of the rail member 202. Preferably, the at least one engaging portion 214 remains being engaged at the engaging position 205 of the rail member 202 through an elastic force of the aforementioned resilient arm 216.

Figure 15:
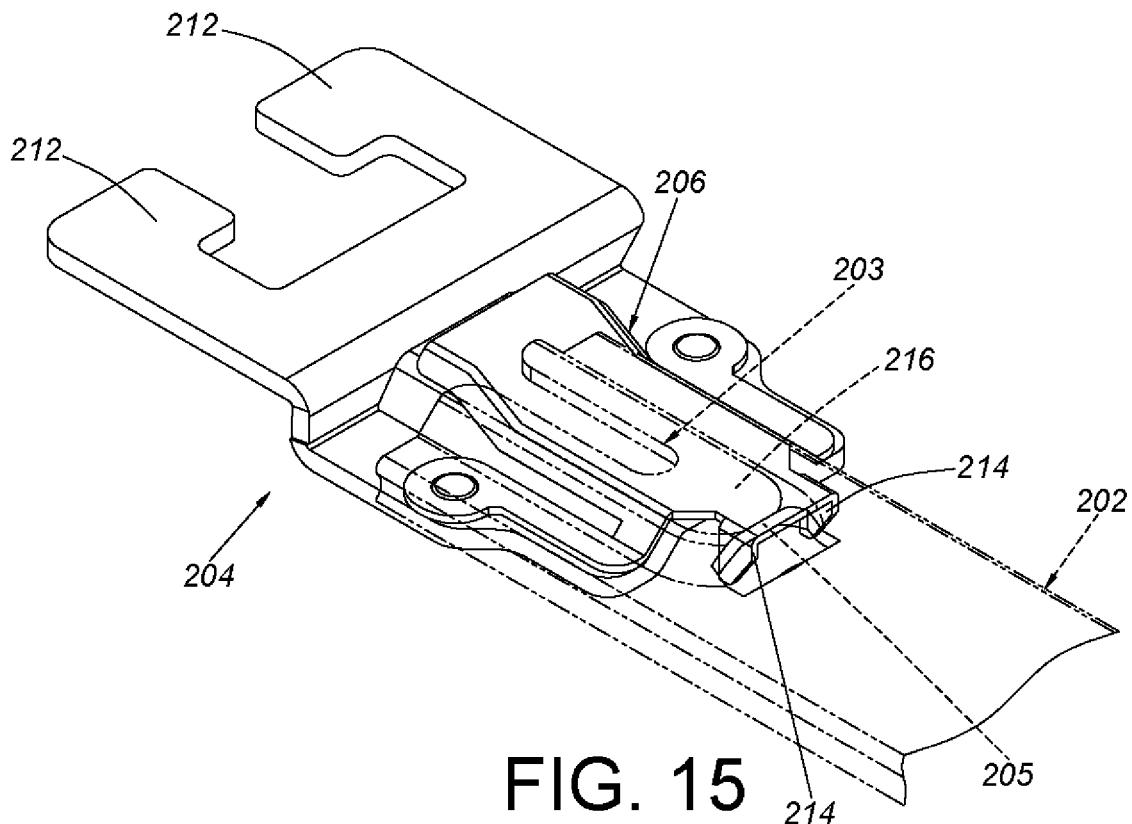
FIG. 15 is a schematic diagram illustrating the connection device being connected to the rail member, wherein an engaging portion is engaged at a position of the rail member according to the second embodiment of the present invention.
Figure 16:
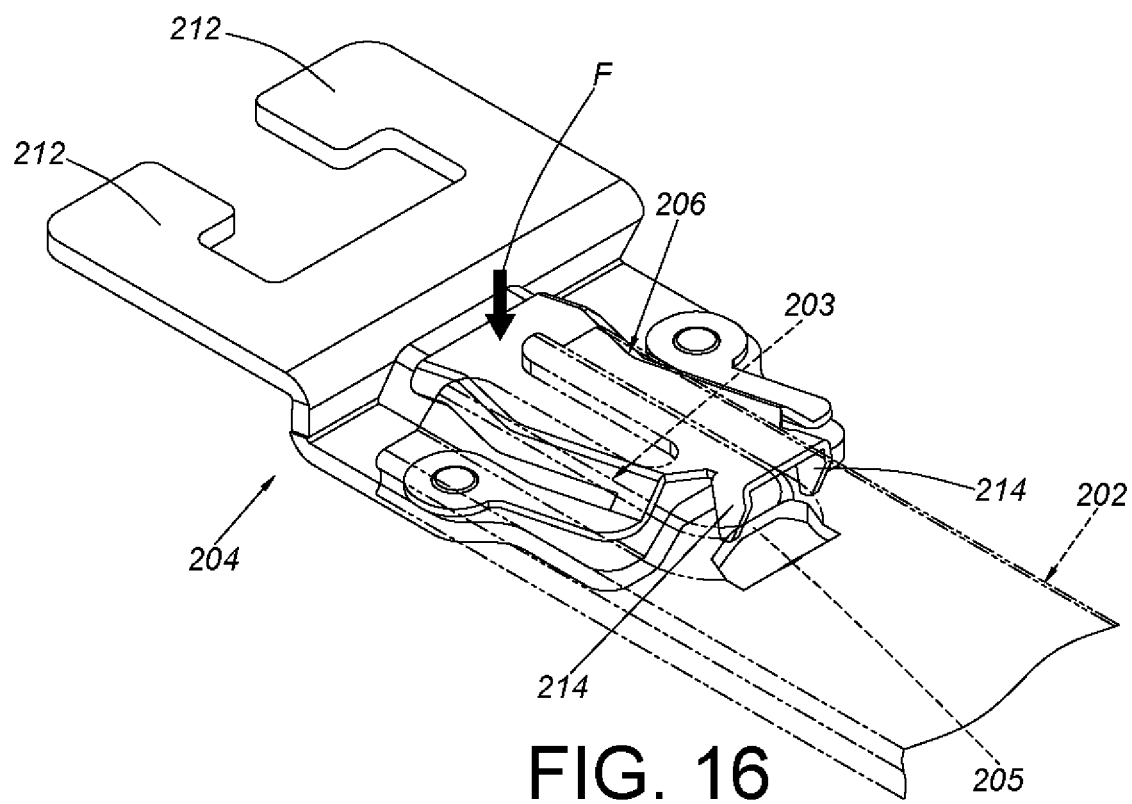
FIG. 16 is a schematic diagram illustrating the connection device being connected to the rail member, wherein the engaging portion is disengaged from the position of the rail member according to the second embodiment of the present invention.

As shown in FIGS. 15 and 16, the engaging member 206 is operable to disengage the at least one engaging portion 214 from the engaging position 205 of the rail member 202 such that the at least one mounting member 208 (shown in FIG. 14) is able to detach from the connecting feature 203 of the rail member 202 and allow the connecting member 204 to be removed from the rail member 202. In this embodiment, a force F can be applied to the engaging member 206 (as shown in FIG. 16) to allow at least one engaging portion 214 to detach from the engaging position 205 of the rail member 202.

It can be seen from the aforementioned embodiments according to the present invention that the connection device 34, 200 herein includes the following advantages:

1. The connection device 34, 200 is detachably connected to an object (such as a rail member), and the connection device 34, 200 is used to connect the object to a cable management arm (such as the first cable management arm 30 or the second cable management arm 32 of the cable management device 28).

2. When the at least one mounting member 46, 208 and the connecting feature 36, 203 abut against each other, the at least one engaging portion 56, 214 of the engaging member 44, 206 is able to be engaged with the object at an engaging position such that the base 52, 210 of the connecting member 42, 204 is connected to the object.

3. The engaging member 44, 206 is operable to disengage the at least one engaging portion 56, 214 from the engaging position of the object, such that the at least one mounting member 46, 208 is able to detach from the connecting feature 36, 203 of the object and allow the connecting member 42, 204 to be removed from the object.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connection device detachably connected to an object, the object comprising a connecting feature, the connection device comprising:
   a connecting member comprising a base and a connecting portion connected to the base;
   an engaging member connected to the connecting member, the engaging member having at least one engaging portion; and
   at least one mounting member fixedly attached to the connecting member;
   wherein when the at least one mounting member and the connecting feature of the object abut against each other, the at least one engaging portion of the engaging member is able to be engaged with the object at an engaging position of the object such that the base of the connecting member is connected to the object;
   wherein the engaging member is operable to disengage the at least one engaging portion from the engaging position of the object such that the at least one mounting member is able to detach from the connecting feature of the object and allow the connecting member to be removed from the object;
   wherein the connecting feature of the object comprises an entrance end, a closed end, and a middle section between the entrance end and the closed end, the entrance end of the connecting feature of the object has a first width, the middle section of the connecting feature of the object has a second width substantially equal to the first width, the at least one mounting member comprises a head portion and a body portion, an outer dimension of the head portion is larger than the first width, an outer dimension of the body portion is smaller than the first width; wherein when the head portion enters the entrance end of the connecting feature of the object and passes through the middle section to abut against the closed end, the head portion is engaged with the object at the engaging position via the at least one engaging portion of the engaging member such that the head portion cannot freely detach from the entrance end of the connecting feature of the object.

2. The connection device of claim 1, wherein the base of the connecting member has a first surface and a second surface opposite to the first surface, and the engaging member is connected to the first surface of the base of the connecting member.

3. The connection device of claim 2, wherein the at least one mounting member is fixedly attached to the second surface of the base of the connecting member.

4. The connection device of claim 1, wherein the engaging member has at least one resilient arm connected to the at least one engaging portion.

5. The connection device of claim 1, wherein the object is a rail member.

6. The connection device of claim 5, wherein the connecting portion of the connecting member is configured to be connected to a cable management arm.

7. The connection device of claim 1, further comprising an operating member pivotally connected to the connecting member, the operating member having a contacting feature abutting against a portion of the engaging member such that the at least one engaging portion of the engaging member is movable relative to the connecting member via operating the operating member.

8. The connection device of claim 1, wherein the object further comprises another connecting feature and another mounting member fixedly attached to the connecting member, and when the connecting member is connected to the object, the another mounting member and the another connecting feature abut against each other.

9. The connection device of claim 1, wherein the engaging position of the object is at a positioning hole of the object, and a position of the positioning hole is different from a position of the connecting feature.

10. A connection device detachably connected to a rail member, the rail member comprising a connecting feature, the connection device comprising:
   a connecting member comprising a base and a connecting portion connected to the base;
   an engaging member connected to the connecting member, the engaging member having at least one engaging portion; and
   at least one mounting member attached to the connecting member, the at least one mounting member comprising a head portion and a body portion;
   wherein the connecting feature of the rail member comprises an entrance end, a closed end and a middle section between the entrance end and the closed end, the entrance end of the connecting feature of the rail member has a first width, the middle section has a second width smaller than the first width, an outer dimension of the head portion of the at least one mounting member is smaller than the first width and larger than the second width; wherein when the head portion enters the entrance end of the connecting feature of the rail member and passes through the middle section to abut against the closed end, the at least one engaging portion of the engaging member is engaged with the rail member at an engaging position of the rail member such that the head portion cannot freely detach from the entrance end of the connecting feature of the rail member;
   wherein the engaging member is operable to disengage the at least one engaging portion from the engaging position of the rail member such that the at least one mounting member is able to detach from the connecting feature of the rail member and allow the connecting member to be removed from the rail member.

11. The connection device of claim 10, wherein the engaging member has at least one resilient arm connected to the at least one engaging portion.

12. The connection device of claim 10, wherein the base of the connecting member has a first surface and a second surface opposite to the first surface, the engaging member is connected to the first surface of the base of the connecting member.

13. The connection device of claim 12, wherein the at least one mounting member is fixedly attached to the second surface of the base of the connecting member.

14. The connection device of claim 10, wherein the base of the connecting member has at least one through hole for the at least one engaging portion of the engaging member to pass through and correspond with the entrance end of the rail member.

15. The connection device of claim 10, wherein the connecting portion of the connecting member is configured to be connected to a cable management arm.

16. The connection device of claim 10, further comprising an operating member pivotally connected to the connecting member, the operating member having a contacting feature abutting against a portion of the engaging member such that the at least one engaging portion of the engaging member is movable relative to the connecting member via operating the operating member.

17. A connection device detachably connected to an object, the object comprising a connecting feature, the connection device comprising:
   a connecting member comprising a base and a connecting portion connected to the base;
   an engaging member connected to the connecting member, the engaging member having at least one engaging portion;
   at least one mounting member fixedly attached to the connecting member; and
   an operating member pivotally connected to the connecting member, the operating member having a contacting feature abutting against a portion of the engaging member such that the at least one engaging portion of the engaging member is movable relative to the connecting member via operating the operating member;
   wherein when the at least one mounting member and the connecting feature of the object abut against each other, the at least one engaging portion of the engaging member is able to be engaged with the object at an engaging position of the object such that the base of the connecting member is connected to the object;
   wherein the engaging member is operable to disengage the at least one engaging portion from the engaging position of the object such that the at least one mounting member is able to detach from the connecting feature of the object and allow the connecting member to be removed from the object.

18. The connection device of claim 17, wherein the base of the connecting member has a first surface and a second surface opposite to the first surface, the engaging member is connected to the first surface of the base of the connecting member, and the at least one mounting member is fixedly attached to the second surface of the base of the connecting member.

19. The connection device of claim 17, wherein the engaging member has at least one resilient arm connected to the at least one engaging portion.

20. The connection device of claim 17, wherein the object further comprises another connecting feature and another mounting member fixedly attached to the connecting member, and when the connecting member is connected to the object, the another mounting member and the another connecting feature abut against each other.

* * * * *